United States Patent [19]

Coppens et al.

[11] Patent Number: 5,405,730
[45] Date of Patent: Apr. 11, 1995

[54] IMAGING ELEMENT AND METHOD FOR MAKING ALUMINUM LITHOGRAPHIC PRINTING PLATES ACCORDING TO THE SILVER SALT DIFFUSION TRANSFER PROCESS

[75] Inventors: Paul Coppens, Turnhout; Marcus Jonckheere, Oostkamp, both of Belgium

[73] Assignee: AGFA-Gevaert, N.V., Mortsel, Belgium

[21] Appl. No.: 266,889

[22] Filed: Jul. 5, 1994

[30] Foreign Application Priority Data

Aug. 5, 1993 [EP] European Pat. Off. ............ 93202313

[51] Int. Cl.$^6$ ........................... G03C 5/54; B41N 1/00
[52] U.S. Cl. .................. 430/204; 101/459; 430/231; 430/278
[58] Field of Search .................. 430/204, 231, 218; 101/459

[56] References Cited

U.S. PATENT DOCUMENTS

| | | | |
|---|---|---|---|
| 3,186,842 | 6/1965 | De Haes et al. | 430/204 |
| 5,061,591 | 10/1991 | Nakanishi et al. | 430/278 |
| 5,196,290 | 3/1993 | Coppens et al. | 430/204 |

*Primary Examiner*—Richard L. Schilling
*Attorney, Agent, or Firm*—Breiner & Breiner

[57] ABSTRACT

The present invention provides an imaging element comprising in the order given (i) a hydrophilic grained and anodized aluminum support, (ii) an image receiving layer containing physical development nuclei and (iii) a photosensitive layer containing a silver halide emulsion being in water permeable relationship with said image receiving layer characterized in that the sum of the surface areas of subsidences amounts to at least 50% of the total surface area area of the grained and anodized side of said support.

10 Claims, No Drawings

IMAGING ELEMENT AND METHOD FOR MAKING ALUMINUM LITHOGRAPHIC PRINTING PLATES ACCORDING TO THE SILVER SALT DIFFUSION TRANSFER PROCESS

DESCRIPTION

1. Field of the Invention

The present invention relates to an imaging element for making improved aluminum offset printing plates according to the silver salt diffusion transfer process. Furthermore the present invention relates to a method for making improved aluminum offset printing plates with said imaging element.

2. Background of the Invention

The principles of the silver complex diffusion transfer reversal process, hereinafter called DTR process, have been described e.g. in U.S. Pat. No. 2,352,014 and in the book "Photographic Silver Halide Diffusion Processes" by André Rott and Edith Weyde—The Focal Press—London and New York, (1972).

In the DTR process non-developed silver halide of an information-wise exposed photographic silver halide emulsion layer material is transformed with a so-called silver halide solvent into soluble silver complex compounds which are allowed to diffuse into an image receiving layer and are reduced therein with a developing agent, generally in the presence of physical development nuclei, to form a silver image having reversed image density values ("DTR image") with respect to the black silver image obtained in the exposed areas of the photographic material.

A DTR image bearing material can be used as a planographic printing plate wherein the DTR silver image areas form the water-repellant ink-receptive areas on a water-receptive ink-repellant background.

The DTR image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two main types of mono-sheet DTR materials that are distinct because of their different layer arrangement and processing are known. The first type of mono-sheet DTR material comprises on a support, generally paper or a resin support such as polyester, in the order given a silver halide emulsion layer and an image receiving layer containing physical development nuclei as a surface layer. After information-wise exposure and development according to the DTR process a silver image is formed in the surface layer. Since the underlying layers are hydrophilic in nature and the silver image formed on the surface is hydrophobic or can be rendered hydrophobic the thus obtained plate can be used without further processing. These type of printing plates have a low printing endurance typically around 10000 copies.

On the other hand mono-sheet DTR materials are known that comprise a hydrophilic support provided with an image receiving layer containing physical development nuclei and on top thereof a silver halide emulsion layer. After information-wise exposure and development according to the DTR-process a silver image is formed in the image receiving layer. In order to obtain a lithographic printing plate it will then be necessary to remove the now useless silver halide emulsion layer to expose the silver image formed in the image receiving layer. Said removal is generally carried out by rinsing the element with cold or warm water. This type of printing plate is disclosed in e.g. EP-A-278766, EP-A-483415 and EP-A-410500.

As a preferred support for the latter type of printing plates a roughened and anodized, aluminum foil is used and high printing endurances can in principle be obtained. Such type of supports are well known for preparing printing plates using an imaging element having as a light sensitive coating photopolymers (hereinafter called PS-plates) instead of silver halide and are disclosed in e.g. DE-3717757, EP-A-167751, DE-3036174, U.S. Pat. Nos. 4,336,113, 4,374,710, 3,980,539, 3,072,546, 3,073,765, 3,085,950, 3,935,080 and 4,052,275.

However the requirements imposed on the aluminum foils for use as supports for PS-plates are different from the requirements imposed on the aluminum foils for use in the silver salt diffusion transfer process. Indeed, commonly employed aluminum foils is supports for PS-plates are not suited for preparing printing plates according to the silver salt diffusion transfer process.

In order to obtain printing plates according to the DTR process having good printing properties e.g. good ink acceptance in the image areas, no ink acceptance in the non-image areas and high printing endurances it has been experimentally stated that the actual yield or amount of silver deposited in the image receiving layer has to be uniformly high. When the yield of-silver deposited in the image receiving layer is low at specific places in the image receiving layer the silver image will be weared away more rapidly during printing at these places and as a consequence the printing endurance may be low.

SUMMARY OF THE INVENTION

It is an object of the present invention to provide an imaging element for making aluminum offset printing plates according to the silver salt diffusion transfer process with improved printing properties.

It is another object of the present invention to provide a method for making aluminum offset printing plates with said imaging element having improved printing properties.

Further objects of the present invention will become clear from the description hereinafter.

According to the present invention there is provided an imaging element comprising in the order given (i) a hydrophilic grained and anodized aluminum support, (ii) an image receiving layer containing physical development nuclei and (iii) a photosensitive layer containing a silver halide emulsion being in water permeable relationship with said image receiving layer characterized in that the sum of the surface areas of subsidences amounts to at least 50% of the total surface area, a subsidence being a section of the real surface of the grained and anodized side of said support having continuously a depth of at least 0.5 μm, a protuberance being a section of the real surface of the grained and anodized side of said support having continuously a depth of less than 0.5 μm, said depths being measured perpendicular to the theoretical surface of the grained and anodized side of said support, said theoretical surface consisting of the lines connecting the highest point in each sampling length of 0.25 mm with the highest point in the neighbouring sampling length(s) of the evaluation length, the total surface area being equated with the sum of the surface areas of the subsidences and of the surface areas of the protuberances and the surface area of a subsidence respectively a protuberance being equated with the area of a circle having as diameter the distance between the intersection of the real surface and lines, being parallel with but 0.5 μm beneath said theoretical surface.

According to the present invention there is also provided a method for making an offset printing plate according to the silver salt diffusion transfer process comprising the steps of:
  (a) image-wise exposing an imaging element as described above,
  (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image,
  (c) treating the imaging element to remove the layer(s) on top of said image receiving layer, thereby uncovering said silver image formed in said image receiving layer.

DETAILED DESCRIPTION OF THE INVENTION

It has been found that an aluminum lithographic printing plate prepared according to the DTR-process using an imaging element comprising a hydrophilic grained and anodized aluminum support wherein the sum of the surface areas of subsidences amounts to at least 50% of the theoretical surface of the grained aluminum support has good printing properties.

The profile of the grained and anodized aluminum support is measured with a perthometer Mahr Perthen S6P containing as measuring head RTK 50 (tradenames of Feinpruef Perthen GmbH, Goettingen, Germany) equipped with a diamond stylus with a diameter of 5 μm under a pressure of 1.0 mN after completely stripping away all supplemental layers and/or foreign substances according to techniques well known in the art.

The sampling length $L_s$ which is the reference length for roughness evaluation and is also the cut-off $\lambda_c$ of the profile filter used for separating the wavelengths belonging to roughness from those belonging to waviness measures 0.25 mm. The evaluation length $L_m$, being that part of the traversing length $L_t$ which is evaluated contains standard 5 Consecutive sampling lengths. The traversing length $L_t$ is the overall length travelled by the tracing system when acquiring the profile.

From this profile a theoretical surface of the aluminum support is easily constructed by connecting by lines the highest point in each sampling length of 0.25 mm with the highest point in the neighbouring sampling length(s) of the evaluation length. The total surface area is then calculated as the sum of the surface areas of the subsidences and of the surface areas of the protuberances. As subsidence is considered a section of the real surface of the grained and anodized side of said support having continuously a depth of at least 0.5 μm. A protuberance is a section of the real surface of the grained and anodized side of said support having continuously a depth of less than 0.5 μm. The depths are measured perpendicular to the theoretical surface of the grained and anodized side of said support. The surface area of a subsidence or a protuberance is equated with the area of a circle having as diameter the distance between the intersection of the real surface and lines, being parallel with but 0.5 μm beneath said theoretical surface. The surface areas of on the one hand the subsidences and on the one hand the protuberances are then totalized.

The profile of the grained and anodized aluminum support is measured as indicated above at three spots of said support, the distance between said spots being at least 1 cm. For each spot, the theoretical surface area and the total surface areas of the subsidences and the protuberances are calculated as also described above. The three theoretical surface areas, the three total surface areas of the subsidences and the three total surface areas of the protuberances are summed up and their ratio's calculated.

According to the invention the graining of the aluminum support is performed in such a way that a grained and anodized aluminum support wherein the sum of the surface areas of subsidences amounts to at least 50% of said total surface is obtained. The upper limit of these ratio is not very important but should preferably be less than 99%. More preferably the sum of the surface areas of subsidences amounts to at least 75% of said theoretical surface, most preferably to at least 90%.

According to the invention subsidences have a continuous depth of at least 0.5 μm. The maximum depth of a subsidence is not very important but should preferably be less than 10 μm. More preferably said subsidences have a maximum depth of at least 1 μm, most preferably a maximum depth of at least 2 μm.

According to the present invention it is preferred that 90% of the protuberances has a surface area not greater than 25 μm$^2$, more preferably not greater than 9 μm$^2$. The average distance between the protuberances, measured at 0.5 μm below the theoretical surface is preferably at least 10 μm.

A grained and anodized aluminum support in accordance with the present invention can be obtained according to the methods well known in the art of preparing aluminum foils, the determining step being the graining, also called the toughening of the aluminum support.

The surface of the aluminum substrate can be roughened either by mechanical, chemical or electrochemical graining or by a combination of these. The electrochemical graining process is preferred because it can form a uniform surface roughness having a large average surface area with a very fine and even grain which is commonly desired for lithographic printing plates.

According to the present invention electrochemical graining can be conducted in a hydrochloric and/or nitric acid and corrosion inhibitors containing electrolyte solution using an alternating or direct current or a combination of both.

A hydrochloric acid containing electrolyte solution contains hydrochloric acid in an amount between 1 and 20 g/l, preferably between 2 and 10 g/l, more preferably between 3 and 8 g/l. Suitable corrosion inhibitors in said solution are boric acid in a concentration between 2 and 20 g/l, preferably between 3 and 12 g/l; AlCl$_3$ in a concentration on Al$^{3+}$ between 2 and 20 g/l, preferably between 3 and 15 g/l; organic acids e.g. acetic acid.

A nitric acid containing electrolyte solution contains nitric acid in an amount between 1 and 40 g/l, preferably between 2 and 20 g/l, more preferably between 3 and 15 g/l. Suitable corrosion inhibitors in said solution are organic acids e.g. acetic acid; AlNO$_3$ in a concentration on Al$^{3+}$ as indicated above.

Electrochemical graining in connection with the present invention can be performed using direct current or alternating current. However, alternating current is preferred, it being single-phase or three-phase alternating current. Alternating current waves can be a sine wave, a square wave, trapezoidal wave, etc. The anodic charge may be greater or lower than the cathodic charge but preferably their ratio is about 1. The voltage applied to the aluminum plate is about 10–100 V, preferably 20–35 V. A current density of 3–150 Amp/dm$^2$, preferably 15–50 Amp/dm$^2$ is employed. The anodic current may vary from 200 to 1000 C/dm$^2$, preferably from 400 to 800 C/dm$^2$. The temperature of the electrolytic graining solution may vary from 0°–50° C., preferably from 20°–40° C. Electrochemical graining is carried out with an alternating current from 10 Hz to 300 Hz, preferably with an alternating current from 30 Hz to 100 Hz, more preferably with an alternating current from 50 Hz to 60 Hz.

The subsidences are all the deeper as the concentration on hydrochloric and/or nitric acid increases, the concentration on corrosion inhibitor is lower, the ratio of the anodic charge versus the cathodic charge is higher and/or the electric current is greater. The number of the subsidences and the sum of their surface area are all the greater as the the concentration on corrosion inhibitor is lower Mechanical and electrochemical methods may be combined as disclosed in U.S. Pat. Nos. 4,476,006 and 4,477,317.

More details on the roughening of aluminum are described by S. Wernick and R. Pinner in "The surface treatment and finishing of aluminum and its alloys", Robert Draper, Teddington (1972).

The roughening is preferably preceded by a degreasing treatment mainly for removing fatty substances from the surface of the aluminum foil. Therefore the aluminum foil may be subjected to a degreasing treatment with a surfactant and/or an aqueous alkaline solution. Degreasing can be performed by a 2-step treatment either treating the aluminum foil with an alkaline solution followed by a desmutting in an acidic solution or degreasing in an acidic solution followed by an alkaline desmutting.

Preferably roughening is followed by a chemical etching step using an aqueous solution containing an acid. Alternatively chemical etching may be carried out using an aqueous solution containing alkali. More details on the etching of an aluminum foil suitable for use in the present invention are given in e.g. EP-A 567178, which therefor is incorporated herein by reference.

The aluminum support of the imaging element used according to the present invention can be made of pure aluminum or of an aluminum alloy, the aluminum content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the support usually ranges from about 0.13 to about 0.50 mm.

The preparation of aluminum or aluminum alloy foils for lithographic offset printing comprises the following steps: graining, anodizing, and optionally sealing of the foil.

According to the present invention after the roughening of the aluminium foil and optional chemical etching the aluminium foil is anodized which may be carried out as follows.

An alternating or direct electric current, preferably a direct electric current is passed through the grained aluminium foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and the voltage within the range 1–100 V to obtain an anodized film weight of 1–8 g/m$^2$ Al$_2$O$_3$.H$_2$O. The anodized aluminium foil may subsequently be rinsed with demineralised water within a temperature range of 10°–80° C.

More details on the anodization of aluminum are described by S. Wernick and R. Pinner in "The surface treatment and finishing of aluminum and its alloys", Robert Draper, Teddington (1972).

After the anodizing step the anodic surface may be posttreated such as sealing. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference. Thanks to the posttreatment longer press runs can be made with the printing plate obtained.

Preferably each of the above described steps is separated by a rinsing step to avoid contamination of the liquid used in a particular step with that of the preceding step.

Subsequent to the preparation of the aluminum support as described above the aluminum support may be immediately coated with a solution containing the physical development nuclei or may be coated with said solution at a later stage.

The image receiving layer used in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546598. Especially preferred development nuclei used in connection with the present invention are palladium sulphide nuclei having an average diameter less than 6 nm and wherein the number of nuclei having a diameter larger than 4.5 nm is less than 15% of the total number of nuclei contained in said image receiving layer.

The imaging element is preferably prepared by coating the photosensitive layer and other optional layers on the hydrophilic grained and anodized aluminum support. Alternatively said layers may be laminated to said support from a temporary support holding the layers in reverse order. Further details are disclosed in U.S. Pat. No. 5,273,858, which therefor is incorporated herein by reference.

To promote the image sharpness and, as a consequence thereof, the sharpness of the final printed copy, the anodization-layer according to the invention may be coloured in the mass with an antihalation dye or pigment e.g. as described in JA-Pu-58-14,797 or the grained, anodized, and optionally sealed aluminum foil according to the invention can be provided with a very thin antihalation coating of a dye or pigment, which may be applied before or after said image receiving layer is applied. Also to promote the image sharpness the image receiving layer may incorporate at least one antihalation dye or pigment. The usual dyes and pigments can be chosen such that they prevent or reduce halation in the silver halide emulsions having any desired photosensitivity range comprised between 300 and 900 nm.

The photosensitive layer used in accordance with the present invention may be any silver halide emulsion layer being in water permeable relationship with said image receiving layer, comprising a hydrophilic colloid binder, at least one of the silver halide emulsions being photosensitive.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

The photographic silver halide emulsion(s) for coating silver halide emulsion layers in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

According to the present invention the silver halide emulsion or emulsions preferably consist principally of silver chloride while a fraction of silver bromide may be present ranging from 1 mole % to 0 mole %. The silver halide emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. Most preferably a silver halide emulsion containing at least 70 mole % of silver chloride is used.

The average size of the silver halide grains may range from 0.10 to 0.70 $\mu$m, preferably from 0.25 to 0.45 $\mu$m.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R.KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been disclosed i.a. in the documents cited in EP-A-93200339.5 and U.S. Pat. No. 5,200,294.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers.

The silver halide emulsions may contain pH controlling ingredients. Preferably the silver halide emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168, 4,311,787, DE-P-2,453,217.

More details about the composition, preparation and coating of silver halide emulsions can be found in e.g. Product Licensing Index, Vol. 92, December 1971, publication 9232, p. 107–109.

The imaging element preferably also comprises an intermediate layer between the image receiving layer on the hydrophilic grained and anodized aluminum support and the photosensitive layer(packet) to facilate the removal of said layer(packet) thereby uncovering the silver image formed in the image receiving layer by processing the imaging element.

In one embodiment, the intermediate layer can be a water-swellable intermediate layer coated at a ratio of 0.01 to 2.0 g/m2 and comprising at least one non-proteinic hydrophilic film-forming polymer and optionally comprising an antihalation dye or pigment as disclosed in EP-A-410500.

In another embodiment, the intermediate layer can be a layer comprising hydrophobic polymer beads having an average diameter not lower than 0.2 $\mu$m and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a photosensitive layer or layer packet onto the image receiving layer the intermediate layer(s) are contained in the photosensitive layer packet, the water-swellable intermediate layer or the intermediate layer comprising hydrophobic polymer beads having an average diameter not lower than 0.2 μm and having been prepared by polymerization of at least one ethylenically unsaturated monomer being the upper layer.

A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer are effected with the aid of an aqueous alkaline solution in the presence of (a) developing agent (s) and (a) silver halide solvent (s). The developing agent (s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic grained and anodized aluminum support.

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. More details are disclosed in EP-A-93201649.6. However other developing agents can be used. Preferred amounts of the hydroquinone-type developing agents are in the range of 0.05 mole to 0.25 mole per litre and preferred amounts of secondary developing agent(s) in the range of $1.8 \times 10^{-3}$ to $2.0 \times 10^{-2}$ mole per litre.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are alkanolamines. Alkanolamines that are suitable for use in accordance with the present invention may be of the tertiary, secondary or primary type. Examples of alkanolamines that may be used in connection with the present invention are disclosed in e.g. EP-A 549830.

According to the present invention the alkanolamines are preferably present in the alkaline processing liquid in a concentration preferably between 0.05% and 10% by weight. However part or all of the alkanolamine can be present in one or more layers of the imaging element.

Further suitable silver halide solvents are thioethers. Preferably used thioethers are disclosed in e.g. U.S. Pat. Nos. 4,960,683 and 5,200,294.

Still further suitable silver halide solvents are meso-ionic compounds. Preferred meso-ionic compounds for use in accordance with the present invention are triazolium thiolates and more preferably 1,2,4-triazolium-3-thiolates. More details are disclosed in EP-A 554585.

Still further suitable silver halide solvents are sulphite, amines, 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857,276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer of the imaging element and to add at least one other silver halide solvent to the developing solution.

Examples of suitable combinations of different silver halide solvents are a combination of (an) alkanolamine(s) and a thiosulfate as disclosed in EP-A 549831 and 4,6-dihydroxypyrimidines in combination with other silver halide solvents as disclosed in EP-A 549830.

The aqueous alkaline solution may further comprise sulphite e.g. sodium sulphite in an amount ranging from 40 g to 180 g per litre, preferably from 60 to 160 g per litre, and a silver halide solvent, preferably a water soluble thiosulphate and/or thiocyanate in an amount ranging from 5 g to 20 g per litre.

Combinations of at least one silver halide solvent and a regulator may also be used. Suitable regulators are disclosed in EP-A 547660 and in EP-A 576736.

The aqueous alkaline solution used according to the present invention preferably comprises aluminum ions in an amount of at least 0.3 g/l in order to prevent sticking of the emulsion layer to the transporting rollers when the emulsion is swollen with the aqueous alkaline solution. More preferably the aqueous alkaline solution used in accordance with the present invention comprises aluminum ions in an amount of at least 0.6 g/l.

The alkaline processing liquid preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help providing the pH and serve as a silver halide complexing agent.

The processing conditions such as pH, temperature and time may vary within broad ranges provided the mechanical strength of the materials to be processed is not adversely influenced and no decomposition takes place.

The aqueous alkaline solution may further comprise hydrophobizing agents for improving the hydrophobicity of the silver image obtained in the image receiving layer. Generally these compounds contain a mercapto group or thiolate group and one or more hydrophobic substituents e.g. an alkyl containing at least 3 carbon atoms. Examples of hydrophobizing agents are e.g. those described in U.S. Pat. Nos. 3,776,728, and 4,563,410. Particularly preferred hydrophobizing agents are long chain (at least 5 carbon atoms) alkyl substituted mercaptotetrazoles. More details are disclosed in EP-A-93201649.6. The hydrophobizing agents can be used alone or in combination with each other.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6 as disclosed in EP-A-519,123.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° 'C.

After formation of the silver image on the lithographic image receiving element an excess of alkaline solution still present on the monosheet layer assemblage may be eliminated, preferably by guiding the monosheet layer assemblage through a pair of squeezing rollers.

The silver image thus obtained in the image receiving layer is subsequently uncovered by treating the imaging element to remove the photosensitive layer and the intermediate layer.

Various embodiments for removing the photosensitive layer and the intermediate layer(s) are disclosed in EP-A 483,415

According to a particularly preferred embodiment for removing the photosensitive layer(s) and the intermediate layer(s) the imaging element is held under a spray or jet of rinsing water or rinsing aqueous medium. The rinsing aqueous medium used to detach the intermediate layer(s) and the emulsion layer(s)(s) by rinsing may comprise ingredients such as i.a. weak acidifying agents, wetting agents, and hardeners including latent hardeners.

The temperature of the rinsing water may be varied widely but is preferably between 20° C. and 30° C.

The imaged surface of the lithographic aluminum support can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic grained and anodized aluminum support. More details on the composition of suitable fixers are given in U.S. Pat. 5,068,165, which therefor is incorporated herein by reference.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an-absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid.

The following example illustrates the present invention without however, limiting it thereto. All parts, percentages and ratios are by weight unless otherwise indicated.

EXAMPLE 1

A 0,30 mm thick aluminum foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current of 50 Hz in an aqueous solution containing 4 g/l of hydrochloric acid and 4 g/l of hydroboric acid at a temperature of 35° C., at a voltage of 25 V and at a current density of 35 Amp/dm$^2$ for 40 s. The aluminum plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film with a weight of 2.4 g/m$^2$ of $Al_2O_3$.

The sum of the surface areas of the subsidences on the grained and anodized side of said support with a maximum depth of at least 1 μm amounts to more than 50% of the total surface of said side of the support. The sum of the surface areas of the subsidences on the grained and anodized side of said support with a maximum depth of at least 0.5 μm amounts to more than 90% of the total surface of said side of the support. More than 90% of the protuberances has a surface area not greater than 16 μm$^2$.

The support was then washed with demineralised water and treated with an aqueous solution of $NaHCO_3$, rinsed with demineralised water and then dried.

An imaging element was obtained by coating said grained, anodized and sealed aluminum support with a silver-receptive stratum containing 0.7 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m², said composition comprising:

| | |
|---|---|
| a 20% dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value: 5.6) | 300 ml |

Finally a substantially unhardened photosensitive negative-working cadmium-free gelatin silver chlorobromoiodide emulsion layer (97.98/2/0.02 mol %) was provided to the obtained element, the silver halide being provided in an amount corresponding to 2.40 g of silver nitrate per m² and the gelatin content of the emulsion layer being 1.58 g/m².

The imaging element was exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminum support the developed monosheet DTR material was rinsed for 30 s with a water jet at 30° C.

Next, the imaged surface of the aluminum support was rubbed with a fixer to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

The printing plate thus prepared was mounted on an offset printing machine (Heidelberg GTO-46) and was printed. A commercial dampening solution AQUA TAME (Tradename) was used at a 5% concentration for fountain solution, and K+E 125 as ink. A compressible rubber blanket was used. The printing results are given in the following Table 1.

The printing endurance, the ink acceptance and the printing quality were evaluated as follows;

a) printing endurance: the number of copies that can be printed from the lithographic plate with an acceptable quality;

b) ink acceptance: the number of copies that has to be printed before a constant print quality with regard to the ink accepting areas is obtained;

c) printing quality: this value relates to the presence of white spots in the ink accepting areas of the 25th copy and is visually evaluated on a relative scale from 0 to 5, where 0 stands for a total absence of white spots in the printing areas where 5 indicates a very high number of white spots in the printing areas.

TABLE 1

| Printing endurance | Ink acceptance | Printing quality |
|---|---|---|
| 80,000 | 10 | 0 |

Evaluation

From the above it can be seen that when a DTR imaging element is used comprising a hydrophilic grained and anodized aluminum support having a surface topography characterized by the fact that the sum of the surface areas of the subsidences on the grained and anodized side of said support with a maximum depth of at least 1 μm amounts to more than 50% of the theoretical surface of said side of the support, the sum of the surface areas of the subsidences on the grained and anodized side of said support with a maximum depth of at least 0.5 μm amounts to more than 90% of the theoretical surface of said side of the support and more than 90% of the protuberances has a surface area not greater than 16 μm², a printing plate with a high printing endurance, a good ink acceptance and good printing quality is obtained.

We claim:

1. An imaging element comprising in the order given (i) a hydrophilic grained and anodized aluminum support, (ii) an image receiving layer containing physical development nuclei and (iii) a photosensitive layer containing a silver halide emulsion being in water permeable relationship with said image receiving layer characterized in that the sum of the surface areas of subsidences amounts to at least 50% of the total surface area, a subsidence being a section of the real surface of the grained and anodized side of said support having continuously a depth of at least 0.5 μm, a protuberance being a section of the real surface of the grained and anodized side of said support having continuously a depth of less than 0.5 μm, said depths being measured perpendicular to the theoretical surface of the grained and anodized side of said support, said theoretical surface consisting of the lines connecting the highest point in each sampling length of 0.25 mm with the highest point in the neighbouring sampling length(s) of the evaluation length, the total surface area being equated with the sum of the surface areas of the subsidences and of the surface areas of the protuberances and the surface area of a subsidence respectively a protuberance being equated with the area of a circle having as diameter the distance between the intersection of the real surface and lines, being parallel with but 0.5 μm beneath said theoretical surface.

2. An imaging element according to claim 1 wherein the sum of the surface areas of subsidences amounts to at least 75% of said total surface area.

3. An imaging element according to claim 1 wherein the sum of the surface areas of subsidences amounts to at least 90% of said total surface area.

4. An imaging element according to claim 1, wherein said subsidences have a maximum depth of at least 1 $\mu$m.

5. An imaging element according to claim 4, wherein said subsidences have a maximum depth of at least 2 $\mu$m.

6. An imaging element according to claim 1, wherein 90% of the protuberances has a surface area not greater than 25 $\mu m^2$.

7. An imaging element according to claim 6, wherein 90% of the protuberances has a surface area not greater than 9 $\mu m^2$.

8. An imaging element according to claim 6, wherein the average distance between the protuberances, measured at 0.5 $\mu$m below the theoretical surface is at least 10 $\mu$m.

9. A method for making an improved aluminum offset printing plate according to the silver salt diffusion transfer process comprising the steps of:
   (a) image-wise exposing an imaging element according to claim 1,
   (b) applying an aqueous alkaline solution to the imaging element in the presence of (a) developing agent(s) and (a) silver halide solvent(s) to form a silver image and to allow unreduced silver halide or complexes formed thereof to diffuse image-wise from the photosensitive layer to said image receiving layer to produce therein a silver image,
   (c) treating the imaging element to remove the layer(s) on top of said image receiving layer, thereby uncovering said silver image formed in said image receiving layer.

10. A method according to claim 9 wherein said imaged surface obtained after removing the photosensitive layer and the intermediate layer, is treated with a fixer to enhance the water-receptivity of the non-image areas and to enhance the ink-receptivity of the image areas.

* * * * *